United States Patent [19]

Chen et al.

[11] Patent Number: 4,535,528
[45] Date of Patent: Aug. 20, 1985

[54] METHOD FOR IMPROVING REFLOW OF PHOSPHOSILICATE GLASS BY ARSENIC IMPLANTATION

[75] Inventors: Devereaux C. Chen, Mt. View; Horng-Sen Fu, Sunnyvale, both of Calif.

[73] Assignee: Hewlett-Packard Company, Palo Alto, Calif.

[21] Appl. No.: 557,577

[22] Filed: Dec. 2, 1983

[51] Int. Cl.³ .................... H01L 21/95; H01L 21/283
[52] U.S. Cl. .................................. 29/571; 29/576 B; 29/576 T; 29/590; 148/1.5; 357/52; 501/63; 427/93
[58] Field of Search .................. 29/571, 576 B, 576 T, 29/576 W, 577 C, 590, 591; 148/1.5; 357/52; 427/93; 501/53, 54, 55, 63

[56] References Cited

U.S. PATENT DOCUMENTS 4,319,260 3/1982 Tasch, Jr. et al. ................. 29/571 X
4,404,733 9/1983 Sasaki .............................. 29/591 X

OTHER PUBLICATIONS

Ahn, J. et al., "Forming Phosphosilicate Glass by Ion Implantation", in *IBM Technical Disclosure Bulletin*, vol. 13, No. 7, 12-1970, p. 1798.

*Primary Examiner*—Brian E. Hearn
*Assistant Examiner*—Alan E. Schiavelli
*Attorney, Agent, or Firm*—Edward Y. Wong

[57] ABSTRACT

A method of making improved step metal coverage of semiconductor device using enhanced reflow of phosphosilicate glass by ion implantation of arsenic at low temperature is provided. In one embodiment, the fabrication processing includes implanting arsenic into the phosphosilicate glass and reflowing the ion implanted phosphosilicate glass by heating the phosphosilicate glass to smooth the phosphosiliate glass for allowing a metal interconnection.

32 Claims, 6 Drawing Figures

METHOD FOR IMPROVING REFLOW OF PHOSPHOSILICATE GLASS BY ARSENIC IMPLANTATION

BACKGROUND OF THE INVENTION

The present invention relates to a method for improving step metal coverage of a semiconductor device, and more particularly to methods of making a semiconductor device using enhanced reflow of phosphosilicate glass by ion implantation of arsenic. The enhanced reflow smooths and rounds step profiles in the phosphosilicate glass, such as a contact window to the substrate through the phosphosilicate glass. The smoothed and rounded profiles result in producing better step metal coverage.

In the fabrication of semiconductor devices and integrated circuits one of the major concerns is the ability of metal lines to cross over abrupt steps and to enter contacts without breaking or thinning. Breakage will cause open circuit failures while thinning will cause a reliability hazard. And if metal lines are fabricated by sputtering or evaporation techniques over abrupt steps, steps due either to an underlying layer having a step profile or to abrupt edges of a layer, such breakage and thinning are almost inherent. In sputtering and evaporation techniques, the abrupt steps cause shadowing of the metal layer being fabricated; the shadowing in turn leads to metal thinning or cracking, or both, in the regions of these steps.

To overcome this problem, one popular approach has been to use phosphorous-doped, low temperature oxide of phosphosilicate glass (PSG) as the dielectric between metal and the substrate, for example, polycrystalline silicon. By flowing the PSG at sufficiently high temperature, which is typically 1000–1100 degrees C., sharp profiles are rounded out, thereby producing better step metal coverage. However, in next generation very large scale integrated circuit (VLSI) processing, such high temperatures will be intolerable due to dopant diffusion and must be reduced. The flow temperature can be reduced using steam ambients, but this leads collaterally to an undesirable oxidation of underlying silicon and to higher island sheet resistance. And if contacts have been etched prior to flow, then steam ambients should definitely be avoided. Otherwise, undesired oxidation occurs.

U.S. Pat. No. 4,319,260 and U.S. Pat. No. 4,355,454 disclose another method of reduced temperature by in situ doping of oxide, viz., using arsine to dope the glass. However, arsine is highly toxic and has not been widely used by the industry.

Borophosphosilicate glass has also been used to reduce temperature. Though giving enhanced flow it presents other problems, such as surface leaching of boron and recrystallization of boric acid crystals. These problems have tended to discourage the wider use of this technique.

SUMMARY OF THE INVENTION

In accordance with a preferred embodiment of the present invention, a method for improving step metal coverage of a semiconductor device using enhanced reflow of phosphosilicate glass by ion implantation of arsenic is provided. Namely, the problem of degraded metal lines over step profiles has been overcome with a new reflow technology. In the new reflow technology arsenic (As) is implanted into PSG. By implanting arsenic into PSG, excellent reflow is obtained in inert ambients, for example, at temperatures as low as 750 degrees C. In the implant technology, percentage of oxygen in nitrogen ambient as well as energy of the arsenic ions have a profound effect on the reflow process. For the case of other implanted species, for example, B, BF2, Fl, Ar, Se, and Sb, reflow comparable to that with PSG has not been observed. Capacitance-voltage (CV) and conduction experiments have further shown the dielectric integrity to be unaffected by the implant. Rutherford Backscattering Spectroscopy (RBS) depth profiling and resistivity measurements show an arsenic distribution with no penetration to the substrate. Therefore, this novel reflow technology is highly advantageous and directly applicable to VLSI processes.

DESCRIPTION OF THE PREFERRED EMBODIMENT

Figure 1:
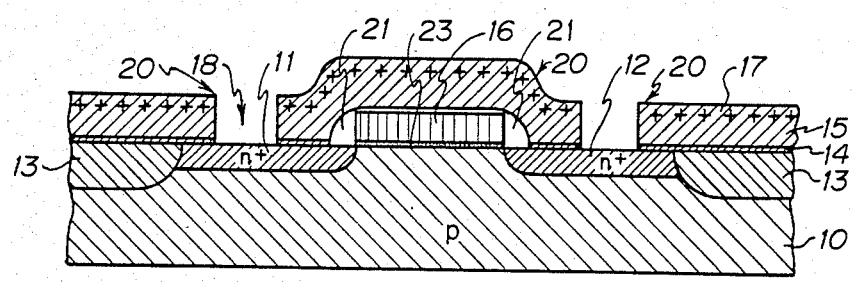
FIG. 1 is a cross-sectional view of an n-channel MOS transistor showing a preferred embodiment of the present invention.
Figure 2:
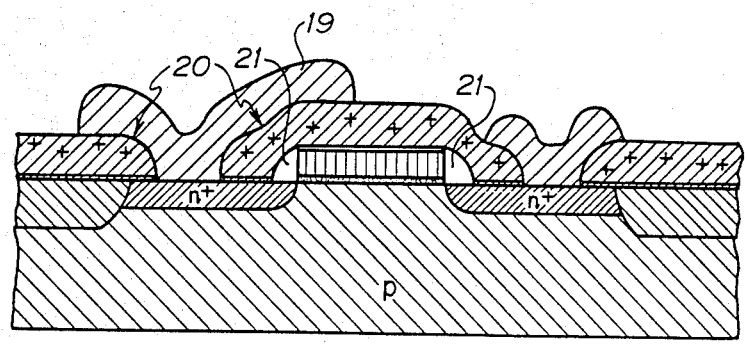
FIG. 2 is a cross-sectional view of an n-channel MOS transistor after enhanced reflow showing smoothed contact and poly steps and metal coverage.

In FIG. 1 an n-channel MOS transistor element in cross section is depicted to represent a preferred embodiment of the invention element could be part of a random access memory, a microprocessor, a VLSI, or other similar semiconductor device. The element is formed in a substrate 10 of semiconductor material of one type of conductivity, preferably p⁻ silicon. Field oxide regions 13 are formed in the substrate 10. A pair of diffused regions 11, 12 of another conductivity type, preferably n+ silicon, form the source 11 and drain 12 regions of the transistor. A conductive member 16, preferably of polycrystalline silicon, which lies over gate oxide 23, forms a gate element between the source 11 and drain 12. Oxide spacers 21 are formed along the edges of the gate 16 by a process described in U.S. Pat. No. 4,356,040. A first insulating layer 14 of thin thermal oxide is then formed on the substrate 10. A second insulating layer 15 of phosphosilicate glass (PSG) is deposited in turn on the first insulator layer 14. The PSG layer 15 is subsequently ion implanted with arsenic 17. By photolithography and etching, a contact window 18 is next formed to the source 11 and drain 12 as shown in FIG. 2. Then the transistor element is flowed in an ambient to round and smooth the abrupt steps 20 of the insulator layer 15. Breakage and thinning problems associated with metal lines 19 over steps are therefore greatly minimized. An improved reflow has been achieved by ion implantation of PSG with arsenic.

In past experiments, two structures are used to evaluate and compare different reflows. In the first, bare silicon wafers are oxidized to a thickness of 450 angstroms. Polysilicon of 3500 angstroms thickness is deposited and abrupt steps are created by photolithography and etching. PSG of 4200 angstroms thickness and 5–8% phosphorus is then deposited. The PSG is subsequently ion-implanted. In the second structure, PSG of similar doping concentration and thickness is deposited onto bare silicon substrates. After ion implantation these wafers, the second structure, are photolithographically patterned and then etched anisotropically. Both structures are then flowed in various ambients, for example, nitrogen or nitrogen with 0–20% oxygen, or steam. Polysilicon 1000–2200 angstroms thick is then deposited at 625 degrees C. to facilitate photographing the structures.

Figure 3:
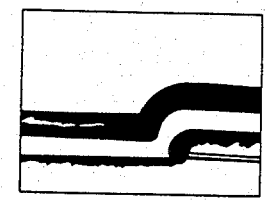
FIG. 3 is a representation of a prior art insulation layer having an abrupt step profile.
Figure 4A:
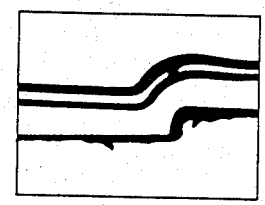
FIGS. 4A–4C are representations of one embodiment of the present invention depicting the smoothing effect resulting from reflow with ion implantation of arsenic.

Experimentation with these structures indicates that reflow of arsenic-implanted PSG is dependent upon the dosage of arsenic for a given incident energy and reflow ambient. For an incident energy of 150 KeV, a reflow ambient of nitrogen with 5% oxygen, and a temperature of 900 degrees C. for 30 minutes, significant improvement in the profiles is achieved with a dose of $10^{16}$ ions per cm$^2$ (E16/cm$^2$). This improvement can be seen by constrasting FIG. 3 with FIGS. 4A–4C. Specifically, FIG. 3 shows the abrupt step of an edge after a prior art reflow at 900 degrees C. for 30 minutes with 5% oxygen without ion implantation of arsenic. However, as shown in FIG. 4A, the step of the edge is significantly smoothed after reflow with ion implantation of arsenic in accordance with the invention.

Figure 4B:
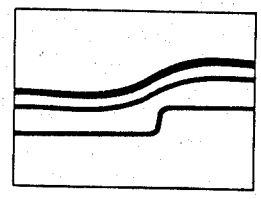
Figure 4C:
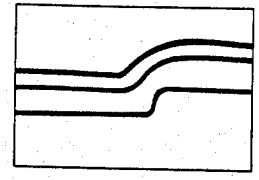

Further experimentation also indicates that the arsenic-implant reflow technique is dependent on both time and temperature. As an example, for a 5E16/cm$^2$ arsenic implant at 150 KeV and a temperature of 800 degrees C. in N$_2$/5%O$_2$, significant improvement in the profiles occurs when the time exceeds 60 minutes, but the profiles does not change drastically after 30 additional minutes. Higher temperatures give better flow. Temperatures ranging from 750 degrees C. to 950 degrees C. appear to enhance reflow. FIGS. 4B and 4C give two examples of temperature-time variations. There 5E16/cm$^2$ of arsenic is implanted at 150 KeV into 8% PSG and flowed in N$_2$/5%O$_2$ for 90 minutes at 850 degrees C. in FIG. 4B and for 270 minutes at 750 degrees C. in FIG. 4C.

To find the effect of oxygen in the reflow ambient, oxygen flow is varied from 0–450 standard cubic centimeter per minute (sccm) in a constant 8600 sccm stream of nitrogen. Higher oxygen flow rates appear to yield better rounding. Above a threshold of about 200 sccm no significant change is produced. In two cases, significant roundings occur by implanting 5E16/cm$^2$ of arsenic into 8% PSG at 150 KeV and flowing in N$_2$/2.4%O$_2$ at 800 degrees C. for 180 minutes.

For a given dose, reflow also depends upon the implant energy of arsenic ions. In a study of reflow at an arsenic dose of 5E16/cm$^2$ and an implant energy ranging from 30 to 150 KeV, it has been found that best reflow occurs at energy greater than 90 KeV.

To understand the enhanced reflow mechanism achieved with arsenic implantation of an insulator in accordance with the present invention, and in particular implantation of a PSG layer, ion implantation effects and arsenic chemical effects upon a PSG system should be examined. In general, ion implantation of heavy ions into PSG can lead to large stress in the PSG. However, wafer bowing measurements using laser scan reveal no significant stress changes after film deposition, ion implantation at E17/cm$^2$ of arsenic and 150 KeV, or reflow. Since similar reflow has not been seen for heavier ions such as Se or Sb, ion-implant-related stress effects alone does not explain enhanced reflow. Any successful enhanced reflow model must account for the exceptional behavior of ion implanted arsenic and its synergy with oxygen. One possible explanation for enhanced reflow is that arsenic is able, in conjunction with oxygen, to reduce the viscosity of the glass sufficiently in the temperature ranges where enhanced reflow occurs, possibly by formation of As$_2$O$_3$, to allow the mass transport needed to reduce surface energy of the glass.

The preferred emobodiment of the present invention has been described in terms of an n-channel MOS device. Other embodiments, however, include PMOS, CMOS and bipolar devices.

We claim:

1. A method of smoothing a layer comprising a phosphosilicate glass layer having a step profile in a semiconductor device comprising the steps of:
    implanting arsenic into said layer; and
    reflowing said layer by heating said layer sufficiently to smooth said layer.

2. A method according to claim 1, wherein said layer includes a layer of silicon dioxide as a barrier layer.

3. A method according to claim 1, wherein said step of heating said layer includes heating said layer to a temperature not exceeding approximately 1000 degrees C.

4. A method according to claim 1, wherein said step of implanting arsenic into said layer includes implanting arsenic above an incident energy of approximately 90 KeV.

5. A method according to claim 1, wherein said step of implanting arsenic into said layer includes implanting arsenic above a range of approximately $10^{16}$ per cm$^2$.

6. A method according to claim 1, wherein said step of reflowing sa:d layer includes reflowing said layer in a reflow ambient of nitrogen with approximately above 3% oxygen.

7. A method according to claim 1, wherein said step of implanting arsenic into said layer includes implanting arsenic above an incident energy of approximately 90 KeV and above a dosage range of approximately $10^{16}$ per cm$^2$, said step of heating said layer includes heating said layer to a temperature not exceeding approximately 1000 degrees C., and said step of reflowing said layer includes reflowing said layer in a reflow ambient of nitrogen with approximately above 3% oxygen.

8. A method according to claim 1, wherein said semiconductor device is an n-channel metal oxide semiconductor device.

9. A method according to claim 1, wherein said semiconductor device is a p-channel metal oxide semiconductor device.

10. A method according to claim 1, wherein said semiconductor device is a complementary metal oxide semiconductor device.

11. A method according to claim 1, wherein said semiconductor device is a bipolar semiconductor device.

12. A method of making a semiconductor device comprising the steps of:
    forming a region of another conductivity type in a substrate of one conductivity type;
    forming an insulator layer comprising a phosphosilicate glass layer on said substrate;
    implanting arsenic into said insulator layer;
    forming a contact window through said insulator layer for allowing a metal coverage contact to said region of another conductivity type; and
    reflowing said insulator layer by heating said insulator layer sufficiently to smooth said insulator layer.

13. A method according to claim 12, wherein the step of forming an insulator layer includes the step of forming a layer of silicon dioxide as a barrier layer and then forming the layer of phosphosilicate glass.

14. A method according to claim 12, wherein said step of heating said insulator layer includes heating said insulator layer to a temperature not exceeding approximately 1000 degrees C.

15. A method according to claim 12, wherein said step of implanting arsenic into said insulator layer includes implanting arsenic above an incident energy of approximately 90 KeV.

16. A method according to claim 12, wherein said step of implanting arsenic into said insulator layer includes implanting arsenic above a dosage range of approximately $10^{16}$ per $cm^2$.

17. A method according to claim 12, wherein said step of reflowing said insulator layer includes reflowing said insulator layer in a reflow ambient of nitrogen with approximately above 3% oxygen.

18. A method according to claim 12, wherein said step of implanting arsenic into said insulator layer includes implanting arsenic above an incident energy of approximately 90 KeV and above a dosage range of approximately $10^{16}$ per $cm^2$, said step of heating said insulator layer includes heating said insulator layer to a temperature not exceeding approximately 1000 degrees C., and said step of reflowing said insulator layer includes reflowing said insulator layer in a reflow ambient of nitrogen with approximately above 3% oxygen.

19. A method according to claim 12, wherein said semiconductor device is an n-channel metal oxide semiconductor device.

20. A method according to claim 12, wherein said semiconductor device is a p-channel metal oxide semiconductor device.

21. A method according to claim 12, wherein said semiconductor device is a complementary metal oxide semiconductor device.

22. A method according to claim 12, wherein said semiconductor device is a bipolar semiconductor device.

23. A method of making a semiconductor device comprising the steps of:
forming a plurality of regions of another conductivity type in a substrate of one conductivity type;
forming an insulator layer comprising a phosphosilicate glass layer on said substrate;
forming at least one layer of gates and gate interconnections on said insulating layer;
forming a multilevel interconnect system insulating layer on said layer of gates and gate interconnections;
implanting arsenic into said multilevel interconnect system insulator layer; and
reflowing said multilevel interconnect system insulator layer by heating said multilevel interconnect system insulator layer sufficiently to smooth said insulator layer.

24. A method according to claim 23, wherein the step of forming an insulator layer includes the step of forming a layer of silicon dioxide as a barrier layer and then forming the layer of phosphosilicate glass.

25. A method according to claim 23, wherein said step of heating said insulator layer includes heating said insulator layer to a temperature not exceeding approximately 1000 degrees C.

26. A method according to claim 23, wherein said step of implanting arsenic into said insulator layer includes implanting arsenic above an incident energy of approximately 90 KeV.

27. A method according to claim 23, wherein said step of implanting arsenic into said insulator layer includes implanting arsenic above a dosage range of approximately $10^{16}$ per $cm^2$.

28. A method according to claim 23, wherein said step of reflowing said insulator layer includes reflowing said insulator layer in a reflow ambient of nitrogen with approximately above 3% oxygen.

29. A method according to claim 23, wherein said step of implanting arsenic into said insulator layer includes implanting arsenic above an incident energy of approximately 90 KeV and above a dosage range of approximately $10^{16}$ per $cm^2$, said step of heating said insulator layer includes heating said insulator layer to a temperature not exceeding approximately 1000 degrees C., and said step of reflowing said insulator layer includes reflowing said insulator layer in a reflow ambient of nitrogen with approximately above 3% oxygen.

30. A method according to claim 23, wherein said semiconductor device is an n-channel metal oxide semiconductor device.

31. A method according to claim 23, wherein said semiconductor device is a p-channel metal oxide semiconductor device.

32. A method according to claim 23, wherein said semiconductor device is a complementary metal oxide semiconductor device.

* * * * *